United States Patent [19]

Reggiardo

[11] Patent Number: 5,446,399

[45] Date of Patent: Aug. 29, 1995

[54] METHOD AND STRUCTURE FOR A FAULT-FREE INPUT CONFIGURATION CONTROL MECHANISM

[75] Inventor: Christopher V. Reggiardo, Alviso, Calif.

[73] Assignee: Varian Associates, Inc., Palo Alto, Calif.

[21] Appl. No.: 342,183

[22] Filed: Nov. 18, 1994

[51] Int. Cl.[6] .................................. G01R 19/155
[52] U.S. Cl. ....................................................... 326/16
[58] Field of Search ................ 326/16, 30; 364/482, 364/483; 324/543, 771

[56] References Cited

U.S. PATENT DOCUMENTS

| | | |
|---|---|---|
| 3,789,205 | 1/1974 | James . |
| 4,241,307 | 12/1980 | Hong . |
| 4,276,619 | 6/1981 | Rickenbacker ............... 364/482 |
| 5,359,291 | 10/1994 | Dommerich, III ............ 324/523 |

*Primary Examiner*—Edward P. Westin
*Assistant Examiner*—Benjamin D. Driscoll

[57] ABSTRACT

A unique configuration control mechanism is disclosed which provides a fault-free verification of digital hardware and software modules, as well as verification of the logic control circuits used to drive said modules.

1 Claim, 2 Drawing Sheets

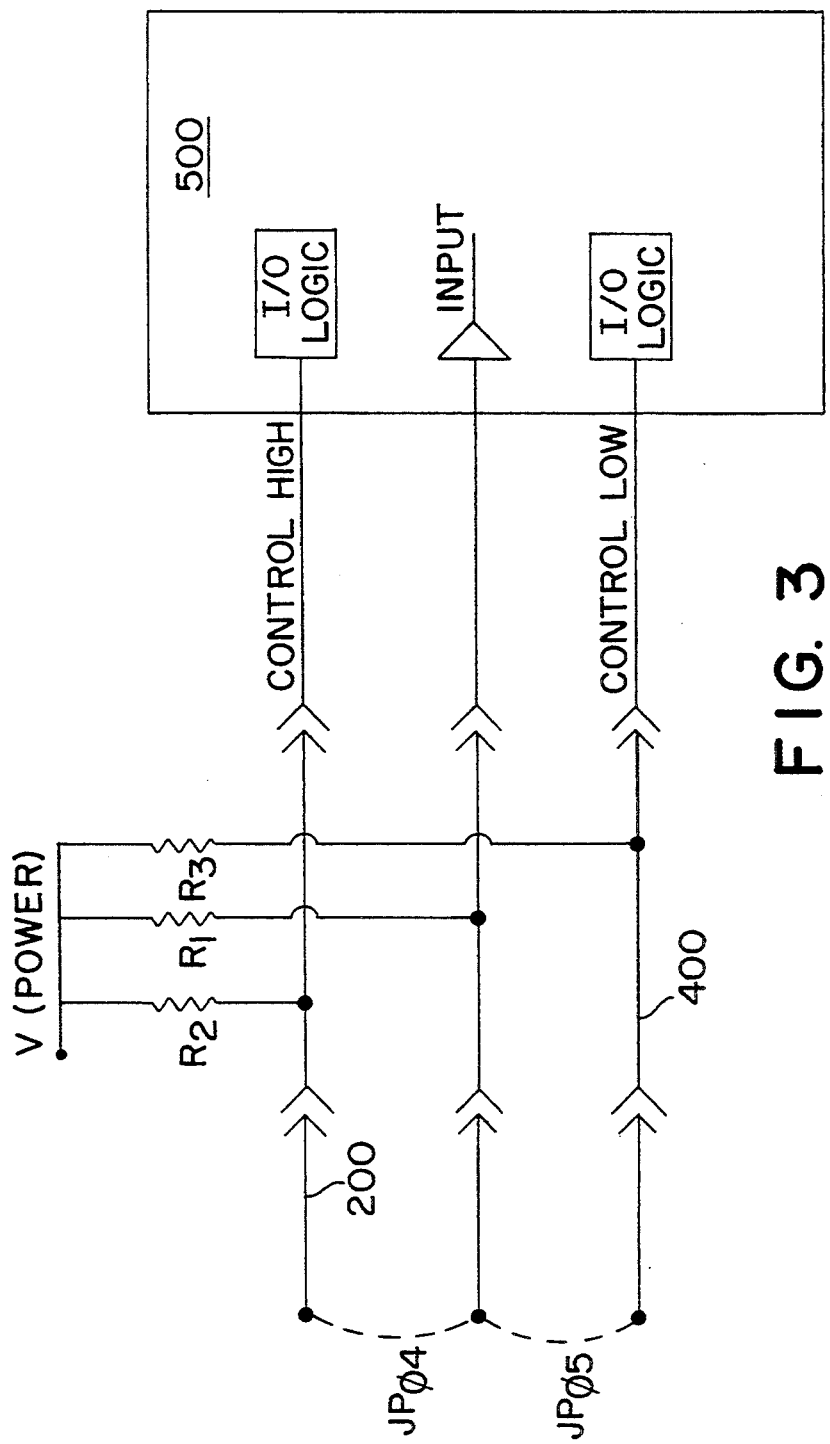

METHOD AND STRUCTURE FOR A FAULT-FREE INPUT CONFIGURATION CONTROL MECHANISM

FIELD OF THE INVENTION

The present invention relates to a configuration control mechanism, more particularly to a fault-free configuration control mechanism for use in digital systems.

BACKGROUND OF THE INVENTION

Current systems used for configuration of digital modules of various electrical systems, such as those used in the operation and control of medical equipment, are configured for a specific type of configuration with normal jumpers. For example, a carrousel controller for a clinical linear accelerator system has a general configuration on the auxiliary electronic backplane of the system that generates configuration frequencies for the control system. The controller for the carrousel usually has a specific set of software instructions, generally through a PROM, and a configuration specific set of phase analysis lines (PALs). In operation a CPU is used to compare the configuration frequencies from the backplane, the PAL signals, and the family of signal types allowed by the software; the CPU then ensures that all three components match before normal operation of the digital control system is allowed. Proper signal type identification is ensured by the configuration specific frequencies, since these frequencies will not be subject to "stuck-at-X" faults as would occur when a poor pin connection in the normal jumpers existed. Checks against poor jumper connections are prevented by verifying the configuration frequencies against the PAL configuration specific signal type codes. These systems are considered fault-tolerant; however they are prone to failure due to radiation and other common electronic device failure modes.

The present systems, however, still are subject to erroneous fault indications as a result of a dysfunctional jumper or faulty pin. This fault tolerant system is not acceptable in critical environments, such as medical device control systems, where all possible failure modes must be checked as a normal part of circuit operation to guarantee fault-free output.

SUMMARY OF THE INVENTION

The method and structure of the invention provides a means for integrating random carrousel control logic without compromising system integrity by making sure the program guarantees algorithm signal type specific, and utilizing a control jumper to check for system faults. The control jumper is checked against poor pin or jumper connections, or open jumpers, by switching the signal type control signal from driven low to floating high impedance through pull up resistors. The control signal is first pulled low and all inputs are checked for a binary ONE reading, indicating a fault condition. If all inputs read binary ZERO, the test is successful and the control signal is released (set to a high impedance) and nominally pulled high by a pull up resistor. The control signal is checked for a binary ZERO reading indicating a fault exists. If these two tests pass the input is verified as valid.

BRIEF DESCRIPTION OF THE DRAWINGS

FIG. 3 shows an alternative embodiment of the present invention for extending the fault-free mechanism into the control logic.

DETAILED DESCRIPTION OF THE INVENTION

Figure 1:
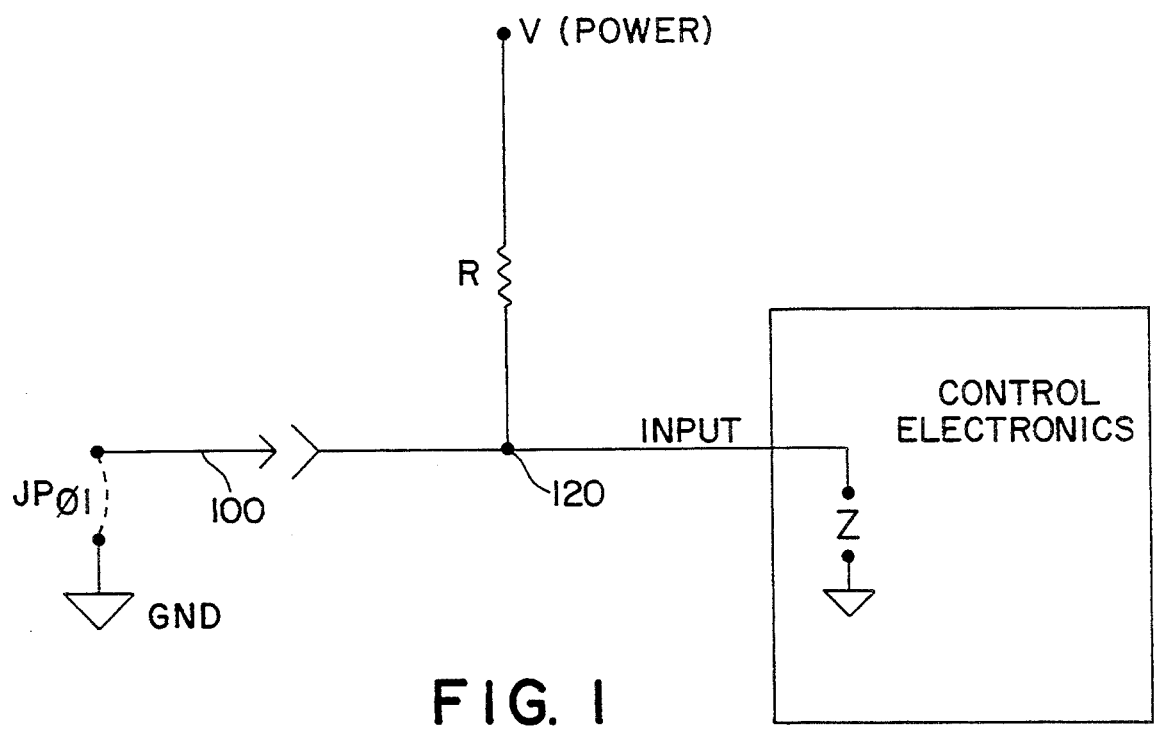
FIG. 1 shows a conventional configuration control circuit of the prior art.

Referring to FIG. 1, a traditional configuration control circuit, recognizable by those skilled in the art, is shown. Discussions of the use of configuration control circuits for accessing digital modules and sensing the occurrence of an error within the modules is found in "Digital Logic and State Machine Design" by David J. Comer, pp 168 and 360, as well as a general discussion in "Logic Design Principles," by Edward J. McCloskey. Additionally, the need for verification of digital signals using means such as parity is further described in the U.S. Pat. No. 3,803,560 to DeVoy, et al., and incorporated herein by reference.

Briefly, the normal operation of the traditional configuration control circuit will be described as a comparison to the present invention. In FIG. 1, element JP01 is representative of one of a series of jumpers used to determine proper signal type identification for input line 100. The configuration circuit operates using either positive or negative logic. Positive logic is such that a binary ONE is equal to a positive signal approaching the power supply value of V, and a binary ZERO is equal to a signal approaching the power supply reference or ground (GND). Therefore, all references to binary bit pattern signals entering or leaving the circuits described herein will be expressed in terms of positive logic (i.e. a signal of approximately GND is a binary ZERO, and a signal of approximately V is a binary ONE). When jumper JP01 is wired to input line 100, wherein the potential at point 120 is pulled down to GND, the result is a nominal binary ZERO reading at point 120. If a fault exists in input line 100 or JP01 is not installed, the high impedance of line 120 is pulled to V by device R, such as a resistor, and a reading of a binary ONE is observed at point 120. Thus, a fault appears at a binary ONE.

Figure 2:
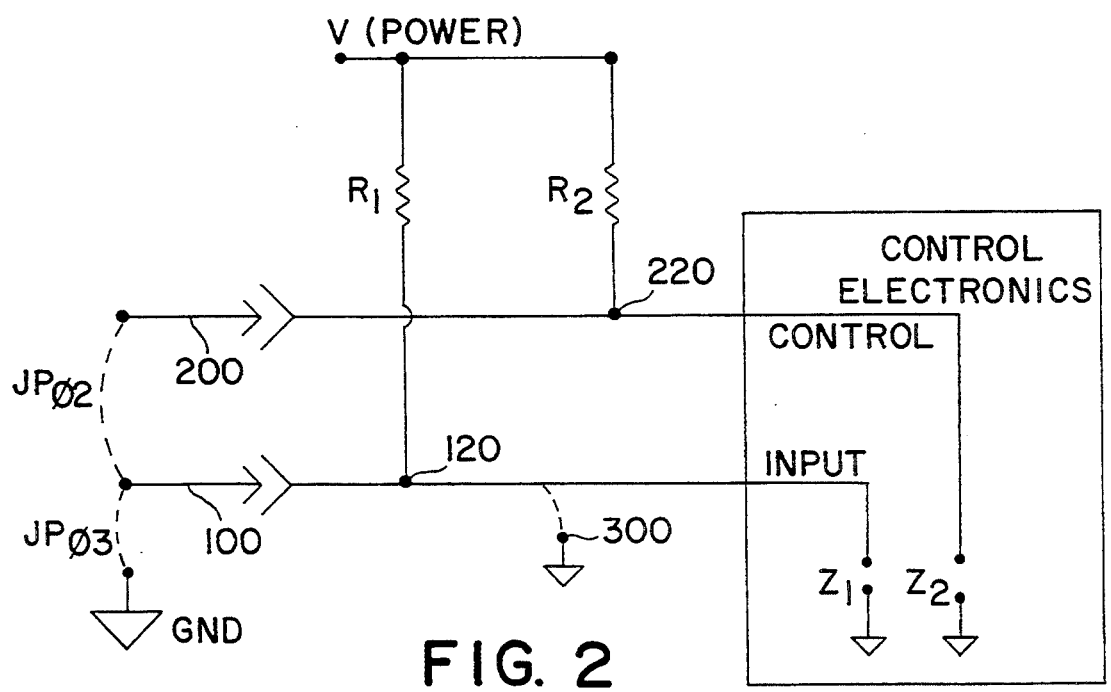
FIG. 2 shows a first embodiment of the circuit design of the present invention.

The problem with the conventional configuration circuit designs is there is no integrity check for either a bad jumper or faulty pin, which would result in an erroneous binary ONE reading. These fault errors are corrected with the configuration control design of the present invention, as depicted in FIG. 2. Referring now to the embodiment shown in FIG. 2, a jumper JP02 or JP03 is shown to tie the input line 100 to a high I/O control line 200 or GND respectively. Examples of conventional jumpers known to those skilled in the art which are suitable for this tie include removable jumpers, soldered in wire jumpers, printed wires on PC boards and single pole double throw (SPDT) switches. The control line 200 is essentially a configuration control circuit in parallel with the conventional circuit depicted in FIG. 1: where many circuits of the type shown in FIG. 1 may be interrogated utilizing the single control circuit of the present invention as shown in FIG. 2 by lines 200 and 220 in conjunction with device $R_2$. The control line is first set low, wherein the impedance $Z_2$ becomes very small, approximating zero, such that the control line 200 is pulled down to GND. Typical tri-state, open collector or open drain devices may be used, as generally known to those skilled in the art. Input line 120 is then checked for any binary ONE reading indicating a fault condition. If all inputs positioned in parallel and of the same type as shown in FIG. 2 indicate a binary ZERO, the initial test is successful. The signal input pull up resistors, $R_1$, ensures that both proper pin and proper jump connections are in place. If either a jumper is missing (JP02 or JP03), or there is a bad jumper or pin connection, then the input signal, as measured at point 120, will be pulled to V by $R_1$, resulting in a binary ONE. A jumper (JP02 or JP03) must be installed and all connections must be valid and complete for a binary ZERO to appear at point 120 though the action of the GND or control connection. Next, the control signal is released and allowed to float (i.e. $Z_2$ becomes a very high impedance), either as a tri-state buffer in the high-Z state, or on an open collector/drain FET configuration, and the control line 220 is checked for any faults which would be indicated by a binary ZERO. (The state of all inputs is unknown or "X" at this time.) An example of such a fault is shown as a short-to-ground 300. In this condition the input reading at 220 is binary ZERO. The test is successful if the control line logic provides a binary ONE reading. If the above two tests are successful, the inputs are guaranteed to be error free and may be used as such.

Using the above system as a configuration control method for a medical device, for example, such as a linear accelerator for use in radiotherapy, if the tests indicate there are no faults, the configuration specific frequencies are generated and sent to a CPU (not shown), which will command the interlocks (I/L) to clear. If a fault is detected, the configuration frequency for Type 31 (Illegal) is generated to denote an error, and the I/Ls are set. The program guarantee algorithm is set to report the nature of the configuration signal regardless of the type of errors, such as mismatched or parity, so that the intended system configuration signal is known to the CPU. By use of the present invention, the current system integrity is not compromised, and the new module being checked will function in the same manner as the current system.

The fault-free mechanism of the present invention may also be extended into the control logic itself by means of the alternative embodiment depicted in FIG. 3, thereby allowing the circuit of the present invention to verify the integrity of the control logic and inputs by ensuring proper chip connections exist and there is no ESD (electro-static discharge) or other similar damage.

As shown in FIG. 3, the embodiment of the invention shown in FIG. 2 and described above is enhanced by the addition of control line 400 having a jumper JP05 and resistance device $R_3$; wherein both the control high line 200 and control low line 400 are coupled to the I/O logic circuit 500. Using the same test procedure previously described herein, control low line 400 and control high line 200 signals are pulled low and all inputs are checked for faults, or binary ONE readings. If this first test passes (i.e. all inputs read binary ZERO), both control signals are released to float high, and all inputs are again checked for faults, or a binary ZERO reading. Finally, the control logic lines themselves are checked by either pulling line 400 low and floating line 200 high, and reading inputs as positive logic, or pulling line 200 low and floating line 400 and reading the inputs as negative logic, while verifying the proper state of the high control line to guard against a short from line 200 to 400.

While the invention has been described with reference to particular embodiments, the invention should not be construed to be so limited. Many modifications may be made by one of ordinary skill in the art with the benefit of the disclosure without departing from the spirit of the invention. Therefore, the scope of the invention should not be limited by the specific examples used for illustration, but only by the scope of the appended claims.

What is claimed is:

1. A configuration control mechanism for use in digital systems comprising:
   a logic circuit having an input means of high impedance, said input means have a first resistive device operably coupled thereto;
   a means of providing a control signal of variable impedance operably coupled to said logic circuit, said control signal means having a second resistive device operably coupled thereto; and
   a connecting means for operably coupling said input means to said control signal means wherein upon said coupling the impedance of said control signal is changed from low to high and changes in said input means are respectively monitored for a system fault signal.

* * * * *